(12) United States Patent
Hong et al.

(10) Patent No.: US 7,871,886 B2
(45) Date of Patent: Jan. 18, 2011

(54) NANOCRYSTAL MEMORY WITH DIFFERENTIAL ENERGY BANDS AND METHOD OF FORMATION

(75) Inventors: Cheong Min Hong, Austin, TX (US); Sung-Taeg Kang, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 72 days.

(21) Appl. No.: 12/436,558

(22) Filed: May 6, 2009

(65) Prior Publication Data

US 2010/0155824 A1 Jun. 24, 2010

Related U.S. Application Data

(63) Continuation-in-part of application No. 12/339,262, filed on Dec. 19, 2008, now Pat. No. 7,799,634.

(51) Int. Cl.
*H01L 21/336* (2006.01)
(52) U.S. Cl. .................. 438/257; 438/260; 438/398; 438/593; 257/E21.422
(58) Field of Classification Search .............. 438/201, 438/257, 260, 539, 398, E21.422
See application file for complete search history.

(56) References Cited

U.S. PATENT DOCUMENTS

| | | | |
|---|---|---|---|
| 6,297,095 B1 | 10/2001 | Muralidhar et al. | |
| 6,320,784 B1 | 11/2001 | Muralidhar et al. | |
| 6,455,372 B1 | 9/2002 | Weimer | |
| 6,784,103 B1 | 8/2004 | Rao et al. | |
| 6,808,986 B2 | 10/2004 | Rao et al. | |
| 6,955,965 B1 | 10/2005 | Halliyal et al. | |
| 6,958,265 B2 | 10/2005 | Steimle et al. | |
| 6,964,902 B2 | 11/2005 | Steimle et al. | |
| 7,091,089 B2 | 8/2006 | Steimle | |
| 7,091,130 B1 | 8/2006 | Rao et al. | |
| 7,183,159 B2 | 2/2007 | Rao et al. | |
| 7,186,616 B2 | 3/2007 | Rao et al. | |
| 7,301,172 B2 * | 11/2007 | Atwater et al. | 257/79 |
| 7,361,543 B2 | 4/2008 | Steimle et al. | |
| 7,361,567 B2 | 4/2008 | Rao et al. | |

(Continued)

OTHER PUBLICATIONS

Notice of Allowance mailed Mar. 3, 2010 on U.S. Appl. No. 12/229,262.

*Primary Examiner*—Michael Trinh
(74) *Attorney, Agent, or Firm*—Kim-Marie Vo; James L. Clingan, Jr.

(57) ABSTRACT

A method of making a semiconductor device using a semiconductor substrate includes forming a first insulating layer having a first band energy over the semiconductor substrate. A first semiconductor layer having a second band energy is formed on the first insulating layer. The first semiconductor layer is annealed to form a plurality of first charge retainer globules from the first semiconductor layer. A first protective film is formed over each charge retainer globule of the plurality of first charge retainer globules. A second semiconductor layer is formed having a third band energy over the plurality of first charge retainer globules. The second semiconductor layer is annealed to form a plurality of storage globules from the second semiconductor layer over the plurality of first charge retainer globules. A magnitude of the second band energy is between a magnitude of the first band energy and a magnitude of the third band energy.

13 Claims, 8 Drawing Sheets

U.S. PATENT DOCUMENTS

| | | |
|---|---|---|
| 7,416,945 B1 | 8/2008 | Muralidhar et al. |
| 7,432,158 B1 | 10/2008 | Rao et al. |
| 7,445,984 B2 | 11/2008 | Rao et al. |
| 7,517,747 B2 | 4/2009 | Muralidhar et al. |
| 7,800,164 B2 * | 9/2010 | Muralidhar et al. ......... 257/325 |
| 2006/0046384 A1 | 3/2006 | Joo et al. |
| 2006/0189079 A1 | 8/2006 | Merchant et al. |
| 2007/0128796 A1 * | 6/2007 | Chu ........................... 438/257 |
| 2008/0296658 A1 * | 12/2008 | Maurelli ..................... 257/321 |

* cited by examiner

US 7,871,886 B2

NANOCRYSTAL MEMORY WITH DIFFERENTIAL ENERGY BANDS AND METHOD OF FORMATION

RELATED APPLICATION

This application is a Continuation-In-Part of U.S. Ser. No. 12/339,262 filed on Dec. 19, 2008, U.S. Pat. No. 7,799,643, and having a common inventor with this application and assigned to the assignee hereof.

FIELD OF THE INVENTION

This invention relates generally to semiconductor devices, and more specifically, to nanocrystal storage devices.

BACKGROUND

Electrically erasable programmable read only memory (EEPROM) structures are commonly used in integrated circuits for non-volatile data storage. EEPROM device structures commonly include a polysilicon floating gate formed over a tunnel dielectric, which is formed over a semiconductor substrate, to store charge. As device dimensions and power supply voltages decrease, the thickness of the tunnel dielectric cannot correspondingly decrease in order to prevent data retention failures. An EEPROM device using isolated silicon nanocrystals or nanoclusters as a replacement to the floating gate does not have the same vulnerability to isolated defects in the tunnel dielectric and thus, permits scaling of the tunnel dielectric and the operating voltage without compromising data retention.

In order to have a significant memory effect as measured by the threshold voltage shift of the EEPROM device, it is necessary to have a high density of silicon nanoclusters of approximately 1E12 nanoclusters per cm$^2$. One method to achieve such a density of nanoclusters is to fabricate the nanoclusters using chemical vapor deposition (CVD) using disilane ($Si_2H_6$). However, the resulting nanoclusters vary in size distribution, which decreases reliability of the EEPROM devices. To improve reliability, a method to form nanoclusters with narrow size distributions at desired densities is needed.

Nanocrystal memories typically have a data storage retention time that is specified as typically no greater than ten years in time. However, there are numerous commercial products which use non-volatile memories that must have a longer retention time. Further scaling of memory devices requires a reduction in operation voltages and program and erase times.

BRIEF DESCRIPTION OF THE DRAWINGS

The present invention is illustrated by way of example and is not limited by the accompanying figures, in which like references indicate similar elements.

Skilled artisans appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

DETAILED DESCRIPTION OF THE DRAWINGS

Figure 1:
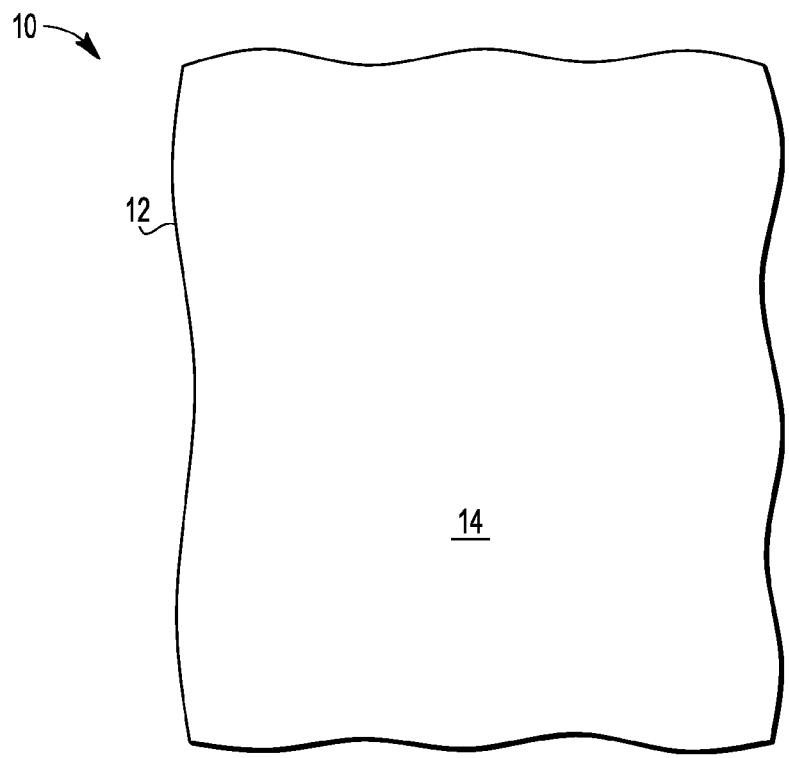
FIG. 1 illustrates a top view of a portion of a semiconductor substrate having an overlying dielectric layer.
Figure 7:
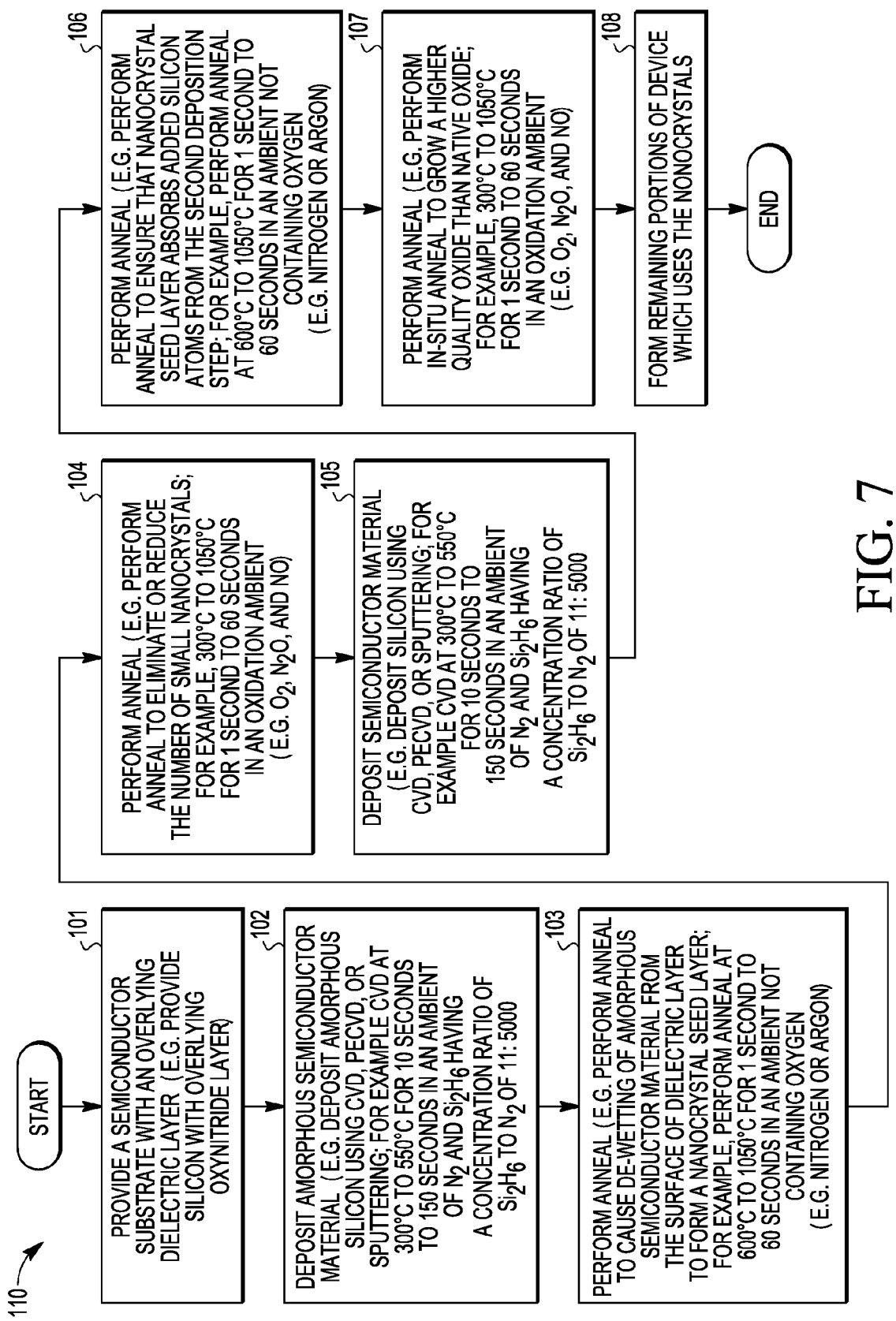
FIG. 7 illustrates, in flow diagram form, a method for forming a device using nanocrystals.

Referring to FIG. 1, in one embodiment, a method of forming nanoclusters includes providing a semiconductor structure 10 having a substrate 12 (e.g. a semiconductor substrate) and forming a dielectric layer 14 overlying the substrate 12 (see step 101 in FIG. 7). Note that for some embodiments, no prior chemical pre-treatment of this dielectric layer is performed. In fact, for some embodiments, prior chemical pre-treatment of this dielectric layer is not necessary and/or is not desirable.

Figure 2:
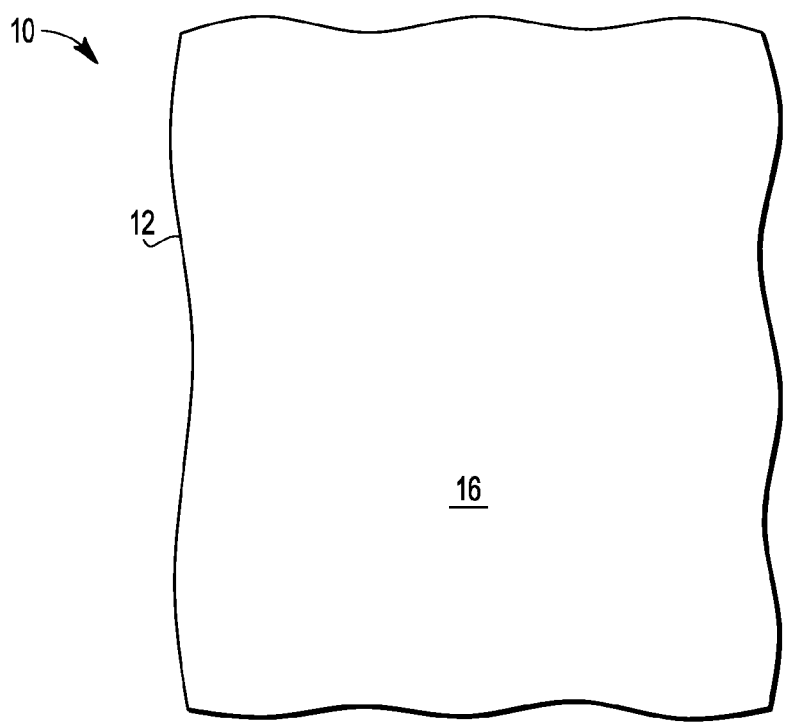
FIG. 2 illustrates a top view of the semiconductor substrate of FIG. 1 when exposed to a first flux of atoms.

Referring to FIG. 2 and step 102 in FIG. 7, in one embodiment, the substrate 12 is then placed in a deposition chamber and a first precursor gas is flowed into the deposition chamber during a first deposition step (see step 102) to form a thin amorphous silicon layer 16 on the dielectric layer 14. This deposition step may be performed using chemical vapor deposition (CVD), plasma enhanced chemical vapor deposition (PECVD), and/or sputtering. Note that atomic layer deposition (ALD) may be used, and is considered as a type of CVD. In one embodiment, CVD is used with a temperature in the range of 300-550 degrees Celsius, for 10-150 seconds, in an ambient of nitrogen ($N_2$) and disilane ($Si_2H_6$) having a concentration ratio of disilane to nitrogen of 11:5000. In an alternate embodiment, CVD is used with a temperature in the range of 450-500 degrees Celsius, for 80-120 seconds, in an ambient of nitrogen ($N_2$) and disilane ($Si_2H_6$) having a concentration ratio of disilane to nitrogen of 11:5000.

Note that the deposition time will determine the thickness of the deposited amorphous silicon layer 16. In one embodiment, the amorphous silicon layer 16 may have a thickness in the range of 10-100 Angstroms. In an alternate embodiment, the amorphous silicon layer 16 may have a thickness in the range of 20-50 Angstroms. In yet another embodiment, the amorphous silicon layer 16 may have a thickness in the range of 30-40 Angstroms. Note that if the deposition temperature is too high, annealing and formation of nanocrystals may occur during the deposition step 102 and it may be more difficult to control the thickness of the amorphous silicon layer 16. By using disilane or trisilane gas, a lower temperature and a lower deposition rate may be used, thus allowing better control of the thickness of the amorphous silicon layer 16. Note that other concentration ratios of disilane or trisilane to nitrogen may be used, so long as a sufficient source of silicon atoms is provided. In alternate embodiment, different ambient gases and different concentration ratios may be used.

Figure 3:
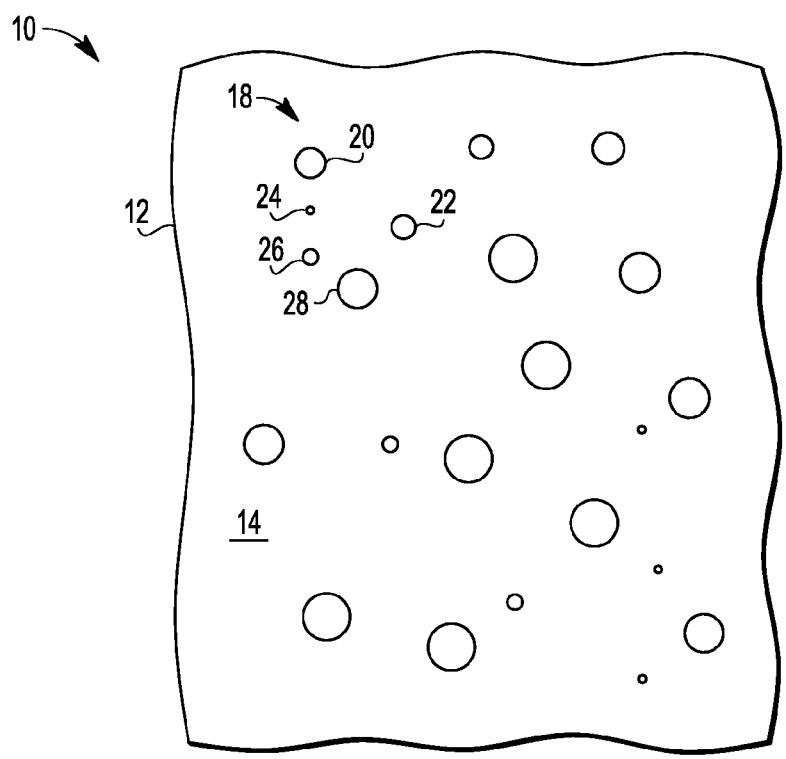
FIG. 3 illustrates a top view of the semiconductor substrate of FIG. 2 after a first anneal.

Referring to FIG. 3 and step 103 in FIG. 7, in one embodiment, substrate 12 is placed in an anneal chamber (e.g. rapid thermal anneal chamber) without being exposed to ambient air (i.e. to perform an in-situ anneal). In one embodiment, this first anneal causes de-wetting of the amorphous silicon layer 16 from the surface of dielectric layer 14 to form a silicon globule seed layer. In this embodiment, the thermodynamics of surface tension results in a dewetting process, wherein the spacing between silicon globules is a function of the initial thickness of the amorphous silicon layer 16. In one embodiment, the anneal is performed at a temperature in the range of 600-1050 Celsius, for a time in the range of 1-60 seconds, in an ambient which does not contain oxygen (e.g. one or more gases which do not contain oxygen). For example, in one embodiment, the ambient may be nitrogen, an inert gas such as argon, or a combination thereof. Note that the temperature used for this first anneal may have a significant impact on the density of the silicon globules. For example, if a higher density of silicon globules is desired, a lower temperature in the range of 600-850 Celsius, for a time in the range of 1-60 seconds, in an ambient which does not contain oxygen (e.g. one or more gases which do not contain oxygen) may be used. In an alternate embodiment, if the highest density of globules is desired, the lowest temperature range (600-700 Celsius), for a time in the range of 1-60 seconds, in an ambient which does not contain oxygen (e.g. one or more gases which do not contain oxygen) may be used. Note that an increased anneal time (e.g. more than 60 seconds) may be used, but will not generally have a significant impact on the silicon globules. Referring to FIG. 3, nanocrystals 18 include individual silicon globule 20, 22, 24, 26, and 28. In one embodiment the atomic arrangement within the globule is crystalline. In another embodiment, the atomic arrangement within the globule could be amorphous. Note that the term nanocrystal will be use herein for silicon globules of either crystalline or amorphous atomic arrangement.

Figure 4:
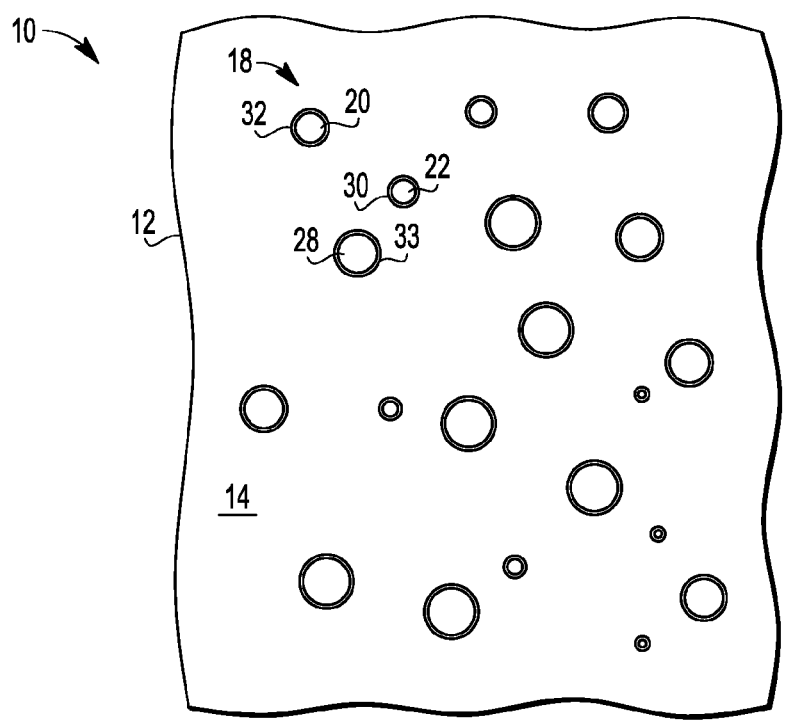
FIG. 4 illustrates a top view of the semiconductor substrate of FIG. 3 after a second anneal.

Referring to FIG. 4 and step 104 in FIG. 7, in one embodiment, substrate 12 is kept in the same anneal chamber and a second in-situ anneal is performed. Alternate embodiments may instead use a separate anneal chamber for this second anneal. Note that in such alternate embodiments, substrate 12 may be exposed to ambient air between the first and second anneals. In one embodiment, this second anneal (e.g. step 104) eliminates or reduces the number of small nanocrystals (e.g. nanocrystals 24 and 26 of FIG. 3) among nanocrystals 18.

In one embodiment, the second anneal (step 104) is performed at a temperature in the range of 300-1050 Celsius, for a time in the range of 1-60 seconds, in an oxidation ambient which does contain oxygen (e.g. one or more gases which do contain oxygen). For example, in one embodiment, the ambient may be $O_2$, $N_2O$, or NO, or any combination thereof. Alternate embodiments may use a different oxidation ambient, such as for example, combining one or more oxygen containing gases with one or more other non-oxygen containing gases. Note that the temperature used for this second anneal may have an impact on the density of the nanocrystals 18 through reducing the number of small nanocrystals. For example, a higher temperature and/or a longer anneal time will further reduce the number of small nanocrystals. Thus, to decrease the number of small nanocrystals, a higher temperature in the range of 750-1050 Celsius, for a time in the range of 1-60 seconds, in an ambient which does contain oxygen (e.g. one or more gases which do contain oxygen) may be used. In an alternate embodiment, a temperature range (600-850 Celsius), for a time in the range of 1-60 seconds, in an ambient that does contain oxygen (e.g. one or more gases that do contain oxygen) may be used. Note that an increased anneal time (e.g. more than 60 seconds) will cause more and more nanocrystals 18 to oxidize. This may be detrimental to the density of the nanocrystals 18.

Referring to FIG. 4, nanocrystals 18 include individual nanocrystals 20, 22, 24, and 26. Nanocrystal 24 is a small nanocrystal that has been fully oxidized by the second anneal (see step 104 in FIG. 7). Some nanocrystals may be absorbed by or combined with other nearby nanocrystals (e.g. nanocrystal 26 may alternately be absorbed by nanocrystal 28 instead of being fully oxidized). After the second anneal, nanocrystal 20 has an outside oxide or oxynitride layer 32; nanocrystal 22 has an outside oxide or oxynidtride layer 30; and nanocrystal 28 has an outside oxide or oxynidtride layer 33. Note that the partial oxidation of nanocrystals 20, 22, and 28 results in these nanocrystals becoming smaller, while the oxidation of small nanocrystals (e.g. 24 and 26) results in these small nanocrystals being fully oxidized (e.g. now being comprised of silicon oxide). And, as a result, the size distribution of the remaining nanocrystals 18 is improved.

Figure 5:
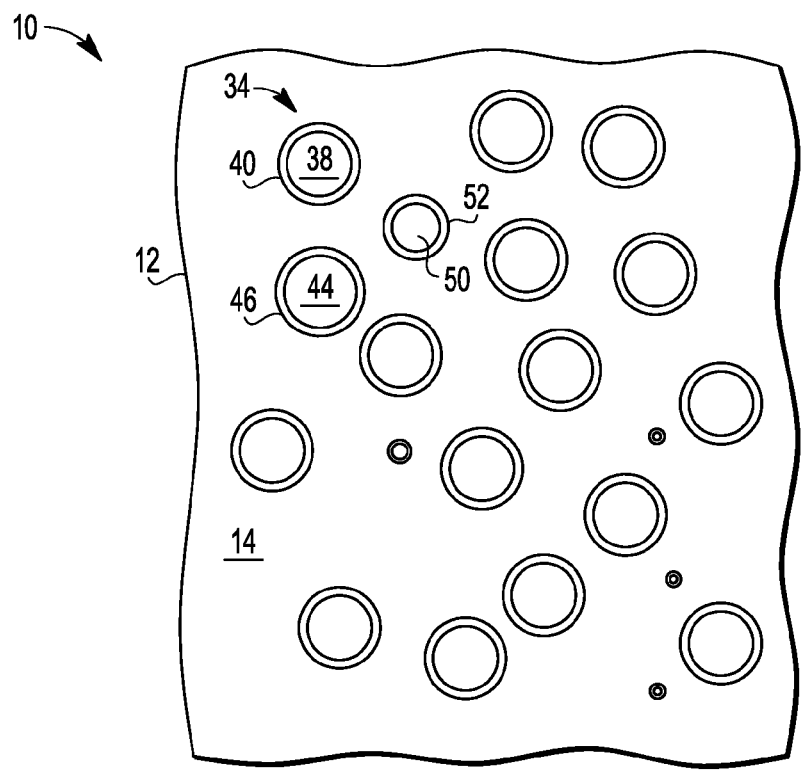
FIG. 5 illustrates a top view of the semiconductor substrate of FIG. 4 exposed to a second flux of atoms and after a third anneal.

Referring to FIG. 5 and step 105 in FIG. 7, in one embodiment, a second deposition of semiconductor material is then performed. In one embodiment, the substrate 12 is again placed in a deposition chamber and a second precursor gas is flowed into the deposition chamber during this second deposition step (see step 105). This deposition step may be performed using chemical vapor deposition (CVD), plasma enhanced chemical vapor deposition (PECVD), and/or sputtering. Note that atomic layer deposition (ALD) may be used, and is considered as a type of CVD. In one embodiment, CVD is used with a temperature in the range of 300-550 degrees Celsius, for 10-150 seconds, in an ambient of nitrogen ($N_2$) and disilane ($Si_2H_6$) having a concentration ratio of disilane to nitrogen of 11:5000. In an alternate embodiment, CVD is used with a temperature in the range of 400-500 degrees Celsius, for 80-120 seconds, in an ambient of nitrogen ($N_2$) and disilane ($Si_2H_6$) having a concentration ratio of disilane to nitrogen of 11:5000.

Still referring to FIG. 5 and step 105 in FIG. 7, note that the deposition time, the deposition temperature, or a combination of deposition time and deposition temperature will determine the size and the coverage of the nanocrystals 18 after subsequent annealing (see annealing steps 106 and 107). Note that other concentration ratios of disilane to nitrogen may be used, so long as a sufficient source of silicon atoms is provided. In alternate embodiment, different ambient gases and different concentration ratios may be used.

Referring to FIG. 5 and step 106 in FIG. 7, in one embodiment, substrate 12 is then placed in an anneal chamber (e.g. rapid thermal anneal chamber) without being exposed to ambient air (i.e. to perform an in-situ anneal). In one embodiment, this third anneal (step 106) ensures that the nanocrystal seed layer absorbs added silicon atoms from the second deposition step (i.e. step 105 in FIG. 7). This absorbing causes nanocrystals 18 to become larger. Note that these larger nanocrystals 34 in FIG. 5 are the same nanocrystals as nanocrystals 18 in FIG. 4, only after the deposition step 105 and the anneal step 106 nanocrystals 18 are now larger (thus the new reference number 34). As the nanocrystals 18 become larger (i.e. now nanocrystals 34), the coverage of the nanocrystals increases. For example, in one embodiment, the density of nanocrystals 34 is at least (i.e. is greater than or equal to) approximately $10^{12}$ globules/centimeter$^2$. Note that for one embodiment, a combination of the thickness of the amorphous silicon layer 16 deposited in step 102 of FIG. 7, along with one or more anneal parameters (e.g. anneal temperature in step 103, and anneal temperature and ambient gas in step 104), affect the resulting density of nanocrystals 34 (e.g. see end of step 106 in FIG. 7). In one embodiment, a nanocrystal coverage of at least 50 percent is achieved after step 106. Note that FIG. 5 illustrates semiconductor structure 10 after both steps 105 and 106 of FIG. 7 have been performed.

In one embodiment, the third anneal (see step 106 in FIG. 7) is performed at a temperature in the range of 600-1050 Celsius, for a time in the range of 1-60 seconds, in an ambient which does not contain oxygen (e.g. one or more gases which do not contain oxygen). For example, in one embodiment, the ambient may be nitrogen, an inert gas such as argon, or a combination thereof. Note that the temperature used for this third anneal, in conjunction with the amount of semiconductor material deposited in step 105, will have a significant impact on the coverage and size of the nanocrystals 18 as they grow to larger nanocrystals 34. For example, in one embodiment, if larger nanocrystals 34 and higher coverage is desired, more semiconductor material deposited in step 105 and a lower temperature in the range of 600-850 Celsius, for a time in the range of 1-60 seconds, in an ambient which does not contain oxygen (e.g. one or more gases which do not contain oxygen) may be used. Note that an increased anneal time (e.g. more than 60 seconds) may be used, but will not generally have a significant impact on the nanocrystals 34. Referring to FIGS. 3, 4, and 5, nanocrystal 38 includes globule 20, nanocrystal 44 includes globule 28, and nanocrystal 50 includes globule 22.

In one embodiment, the nanocrystals 34 of FIG. 5 may have an average diameter of approximately 200 Angstroms, or alternately an average diameter at least equal to 170 Angstroms. In an alternate embodiment, the nanocrystals 34 may have an average diameter in a range from approximately 140 Angstrom to approximately 220 Angstroms.

Referring to FIG. 5 and step 107 in FIG. 7, in one embodiment, substrate 12 is kept in the same anneal chamber and a fourth in-situ anneal is performed. Alternate embodiments may instead use a separate anneal chamber for this fourth anneal (step 107). Note that in such alternate embodiments, substrate 12 may be exposed to ambient air between the third and fourth anneals. In one embodiment, this fourth anneal results in the growth of a higher quality oxide or oxynitride rather than the growth of native oxide that would result from exposure to ambient air.

In one embodiment, the fourth anneal (see step 107 in FIG. 7) is performed at a temperature in the range of 300-1050 Celsius, for a time in the range of 1-60 seconds, in an oxidation ambient which does contain oxygen (e.g. one or more gases which do contain oxygen). For example, in one embodiment, the ambient may be $O_2$, $N_2O$, or NO, or any combination thereof. Alternate embodiments may use a different oxidation ambient, such as for example, combining one or more oxygen containing gases with one or more other non-oxygen containing gases. Note that an increased anneal time (e.g. more than 60 seconds) will cause more and more nanocrystals 34 to oxidize. This may be detrimental to the size of the nanocrystals 34.

Still referring to FIG. 5 (after step 106 of FIG. 7), nanocrystals 34 include individual nanocrystals 38, 44, and 50. Note that nanocrystals 24 and 26 from FIG. 3 have been fully oxidized and are no longer shown in FIG. 5. After the third anneal (step 106), nanocrystal 38 has an outside oxide or oxynitride layer 40; nanocrystal 44 has an outside oxide or oxynitride layer 46; and nanocrystal 50 has an outside oxide or oxynitride layer 52.

Figure 6:
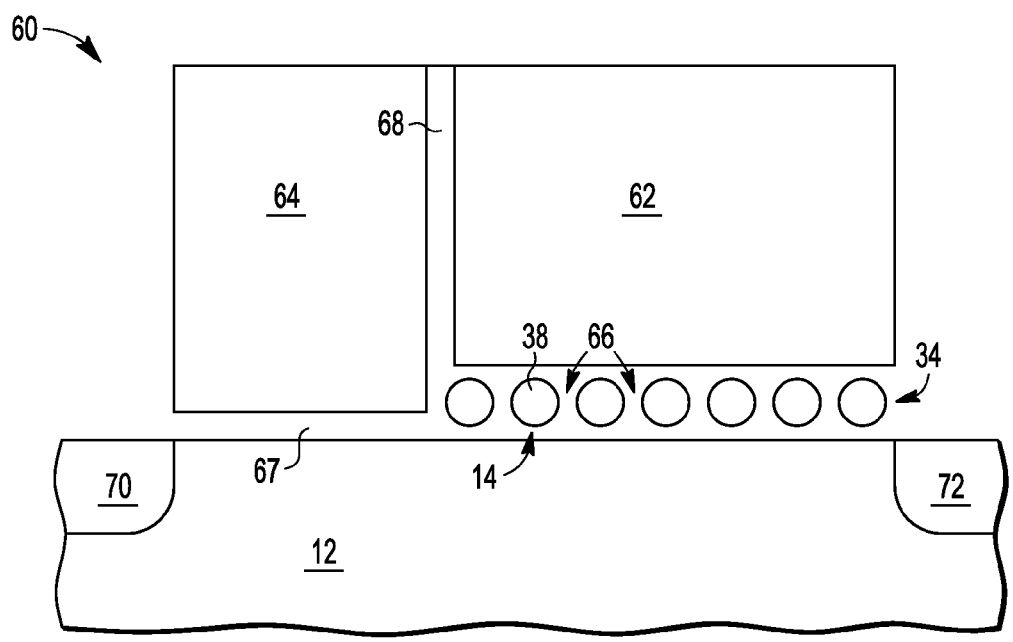
FIG. 6 illustrates a cross-sectional view of the semiconductor substrate of FIG. 5 after a second anneal and after forming the remaining portions of a non-volatile memory cell.

Referring to FIG. 6 and step 108 in FIG. 7, in one embodiment a non-volatile memory (NVM) cell 60 is formed comprising a control gate 62 and a select gate 64 having an insulating layer 68 formed between control gate 62 and select gate 64. A first source/drain region 70 and a second source/drain region 72 are formed in substrate 12. Nanocrystals 36 are encompassed by overlying and fill oxide 66 as well as dielectric layer 14. Insulating layer 67 is interposed between select gate 64 and substrate 12. In one embodiment, NVM cell 60 is part of the semiconductor structure 10. Although FIG. 6 illustrates nanocrystals 34 as being used in a non-volatile memory cell 60, alternate embodiments may use nanocrystals 34 in any desired and appropriate semiconductor device.

Figure 8:
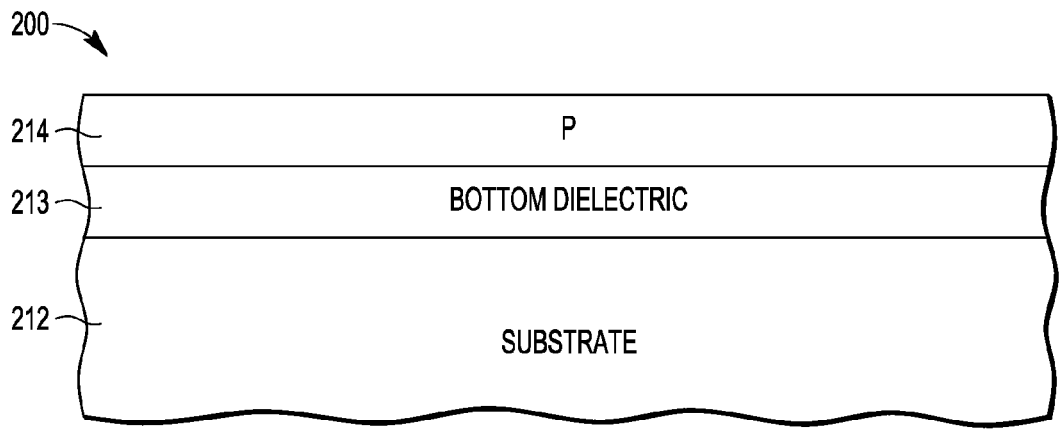
FIGS. 8-15 illustrate in cross-sectional views a nanocrystal memory with differential energy bands and method of formation in accordance with one form of the present invention.

Illustrated in FIG. 8 is a cross-sectional view of a semiconductor device 200 for implementing a nanocrystal storage device having differential energy bands. A substrate 212 is provided. The substrate 212 may be implemented from any of numerous semiconductor materials, including single or polycrystalline silicon. Additionally, the substrate 212 may be implemented by a silicon-on-insulator (SOI) structure in which an insulating layer (not shown) underlies the substrate 212 which is formed of conduction material. Overlying the substrate 212 is a bottom dielectric layer 213. In one form the bottom dielectric is silicon dioxide. In other forms various other insulating materials may be used including nitride and any high-k dielectric materials. The bottom dielectric layer 213 is grown on the substrate 212 if silicon dioxide or nitride is selected as the dielectric material. Overlying the bottom dielectric layer 213 is a charge retainer layer 214. The charge retainer layer 214, in one form, is amorphous silicon material which is deposited using any of CVD, PECVD and/or sputtering as explained above. In one form CVD at 300 to 550 degrees Celsius for ten to one hundred fifty seconds in an ambient of nitrogen, disilane and boron fluoride ($BF_3$). The charge retainer layer 214 is in-situ P-doped. Any of various dopant materials may be used, such as $BF_3$ (boron fluoride). In an alternative form the charge retainer layer 214 may be implemented as an undoped material.

Figure 9:
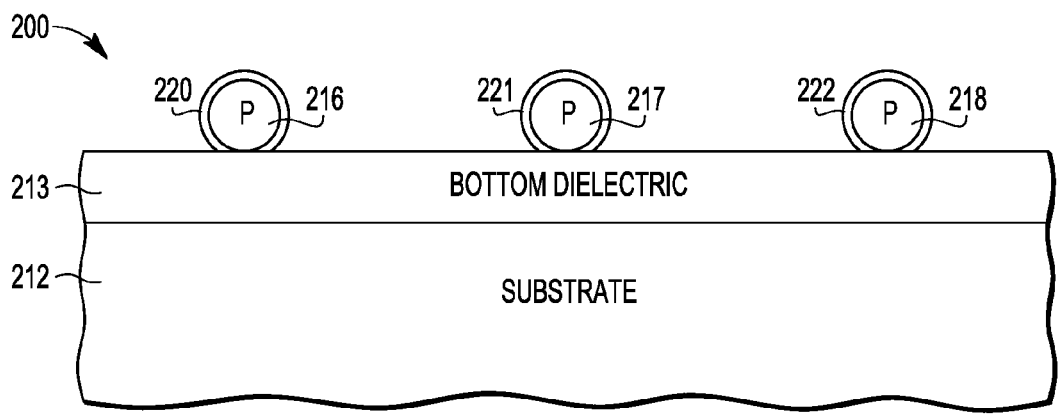

Illustrated in FIG. 9 is further processing of the semiconductor device 200 wherein a first anneal is performed. The first anneal causes de-wetting of amorphous semiconductor material of charge retainer layer 214 from the surface of the bottom dielectric layer 213. The first anneal forms a nanocrystal seed layer in the form of charge retainer globules 216, 217 and 218. These globules function to retain charge and may be referenced as either charge retaining or charge retainer globules. In one form the ambient gases during the first anneal is nitrogen (N) or argon (Ar). A second anneal, in a same processing chamber, follows the first anneal. The second anneal eliminates or reduces the number of charge retainer globules, such as charge retainer globules 216, 217 and 218. In one form the second anneal is performed at a temperature in the range of 300 degrees Celsius to 1,050 degrees Celsius for a time in a range of 1 second to 60 seconds in an oxidation ambient, such as $O_2$, $N_2O$ and NO. The oxidation ambient results in a protective film 220 surrounding charge retainer globule 216, a protective film 221 surrounding charge retainer globule 217 and a protective film 222 surrounding charge retainer globule 218. The protective films 220-222 serve as a protective barrier for preventing the doped material of the charge retainer globules 216-218 from being subsequently electrically modified.

Figure 10:
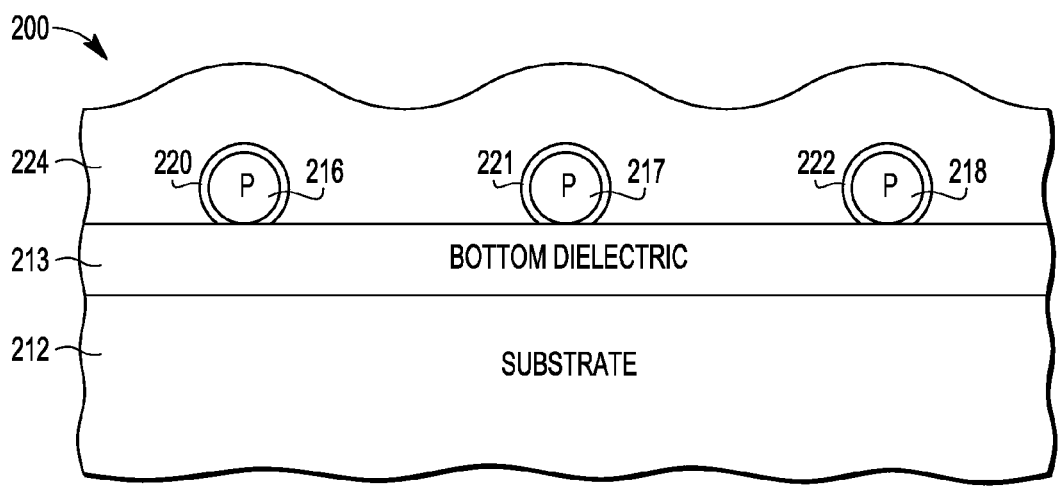

Illustrated in FIG. 10 is further processing of semiconductor device 200. A semiconductor material that functions as a charge storage layer 224 is conformally deposited. A suitable semiconductor material that may be used for this semiconductor material is N-type in-situ doped silicon which may be deposited by any of CVD, PECVD or sputtering at a temperature in the range of 300 degrees Celsius to 550 degrees Celsius and for a time of ten seconds to one hundred fifty seconds in an ambient of nitrogen ($N_2$) and disilane ($Si_2H_6$) and phosphine ($PH_3$).

Figure 11:
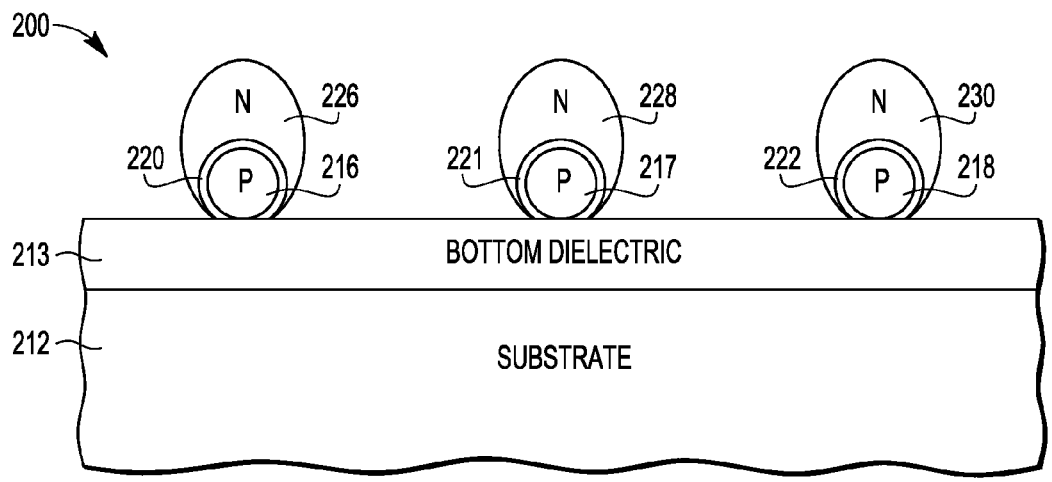
Figure 12:
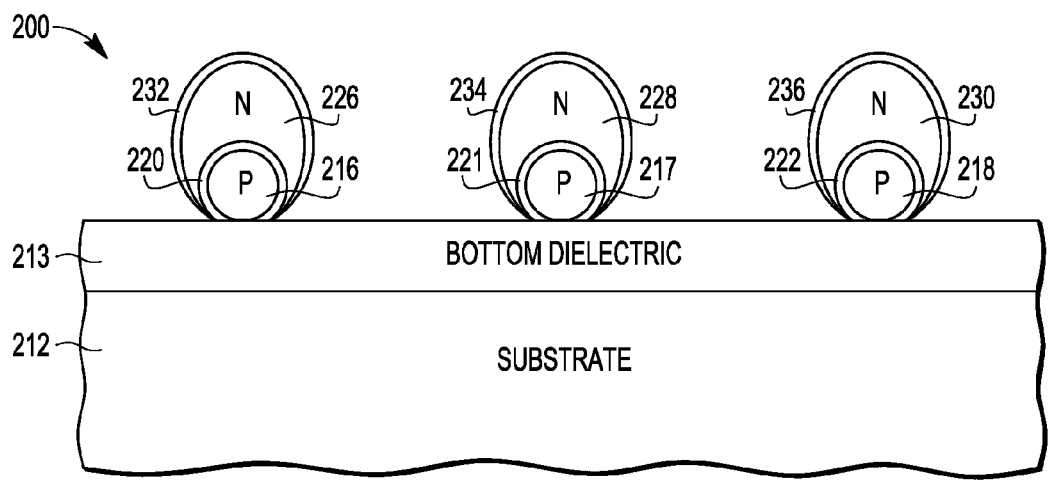

Illustrated in FIGS. 11 and 12 is further processing of semiconductor device 200 wherein a two-step anneal is performed. The first anneal step causes formation of the charge storage globules 226, 228 and 230. In one form the ambient gases during the first anneal is nitrogen (N) or argon (Ar). Because charge storage layer 224 is in-situ doped to be N doping, each of the charge storage globules 226, 228 and 230 are also N-type doping. It should be noted that each of the charge storage globules 226, 228 and 230 is thicker (i.e. has a larger height) than the respective charge retainer globules 216-218.

Illustrated in FIG. 12 is processing wherein the second anneal step is performed in a same processing chamber as the first anneal step. The second anneal step oxidizes the exposed surfaces of the charge storage globules 226, 228 and 230 to respectively form protective films 232, 234 and 236. In one form the second anneal step is performed at a temperature in the range of 300 degrees Celsius to 1,050 degrees Celsius for a time in a range of 1 second to 60 seconds in an oxidation ambient, such as $O_2$, $N_2O$ and NO. The protective films 232, 234 and 236 function to protect the existing doping concentration of charge storage globules 226, 228 and 230 as well as charge retainer globules 216-218 from being modified by subsequent processing steps.

Figure 13:
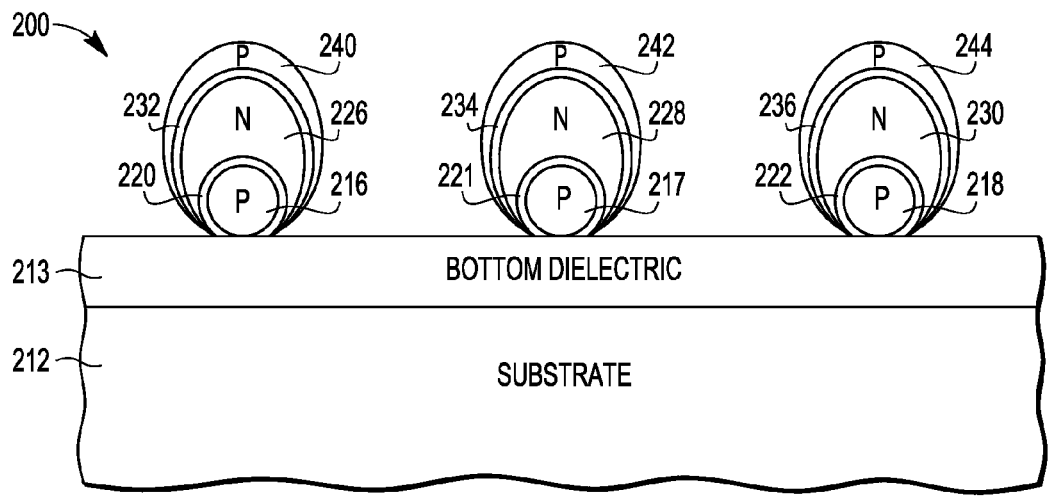

Illustrated in FIG. 13 is further processing of the semiconductor device 200 wherein charge retainer globules 240, 242 and 244 are respectively formed overlying protective films 232, 234 and 236. A semiconductor material that functions as a charge retainer layer (not shown) is conformally deposited. A suitable semiconductor material that may be used for this semiconductor material is P-type in-situ doped silicon which may be deposited by any of CVD, PECVD or sputtering at a temperature in the range of 300 degrees Celsius to 550 degrees Celsius and for a time of ten seconds to one-hundred-fifty seconds in an ambient of nitrogen ($N_2$) and disilane ($Si_2H_6$) and boron fluoride ($BF_3$). A first anneal step of a two-step anneal causes formation of the charge retainer globules 240, 242 and 244. In one form the ambient gases during the first anneal is nitrogen (N) or argon (Ar). It should be noted that each of the charge retainer globules 240, 242 and 244 is thinner (i.e. has a smaller height) than the respective charge storage globules 226, 228 and 230.

Figure 14:
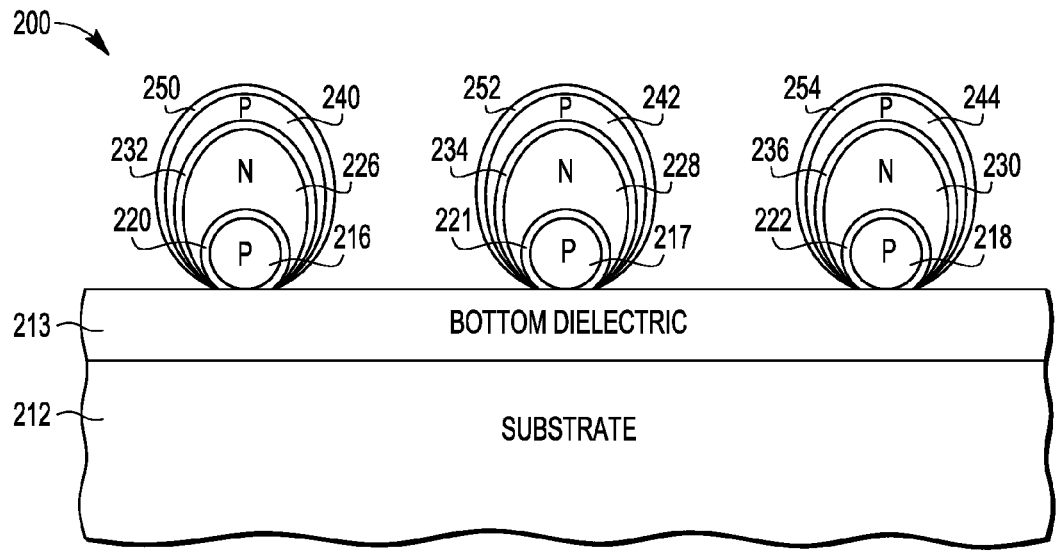

Illustrated in FIG. 14 is further processing of semiconductor device 200 wherein a second anneal step is performed in a same processing chamber as the first anneal step. The second anneal step oxidizes the exposed surfaces of the charge retainer globules 240, 242 and 244 to respectively form protective films 250, 252 and 254. In one form the second anneal step is performed at a temperature in the range of 300 degrees Celsius to 1,050 degrees Celsius for a time in a range of 1 second to 60 seconds in an oxidation ambient, such as $O_2$, $N_2O$ and NO. The protective films 250, 252 and 254 function to protect the existing doping concentration of charge retainer globules 240, 242 and 244.

Figure 15:
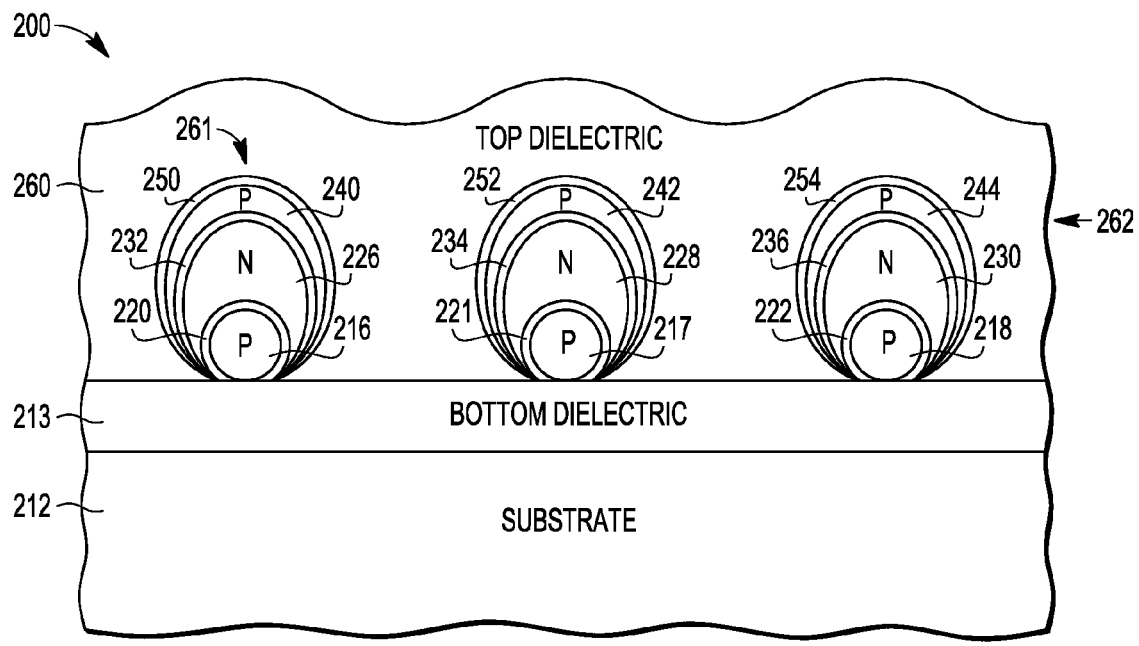

Illustrated in FIG. 15 is further processing of semiconductor device 200 wherein a top dielectric 260 is formed overlying the existing semiconductor device 200. The top dielectric 260 may be an oxide, a nitride or any high-k dielectric material. The top dielectric 260 is formed by deposition by one of CVD, PECVD or LPCVD, for example. In the illustrated form a plurality of nanocrystals, such as nanocrystal 261, to form a charge storage layer 262 in the semiconductor device 200. The top dielectric 260 is both overlying and between each of the nanocrystals of the semiconductor device 200. It should be understood that further semiconductor structures (not shown), such as a transistor gate of a memory may be formed in combination with semiconductor device 200. For example, the control gate 62 of FIG. 6 may be formed over the top dielectric 260 wherein the top dielectric 260 is equivalent to the fill oxide 66 of FIG. 6.

Figure 16:
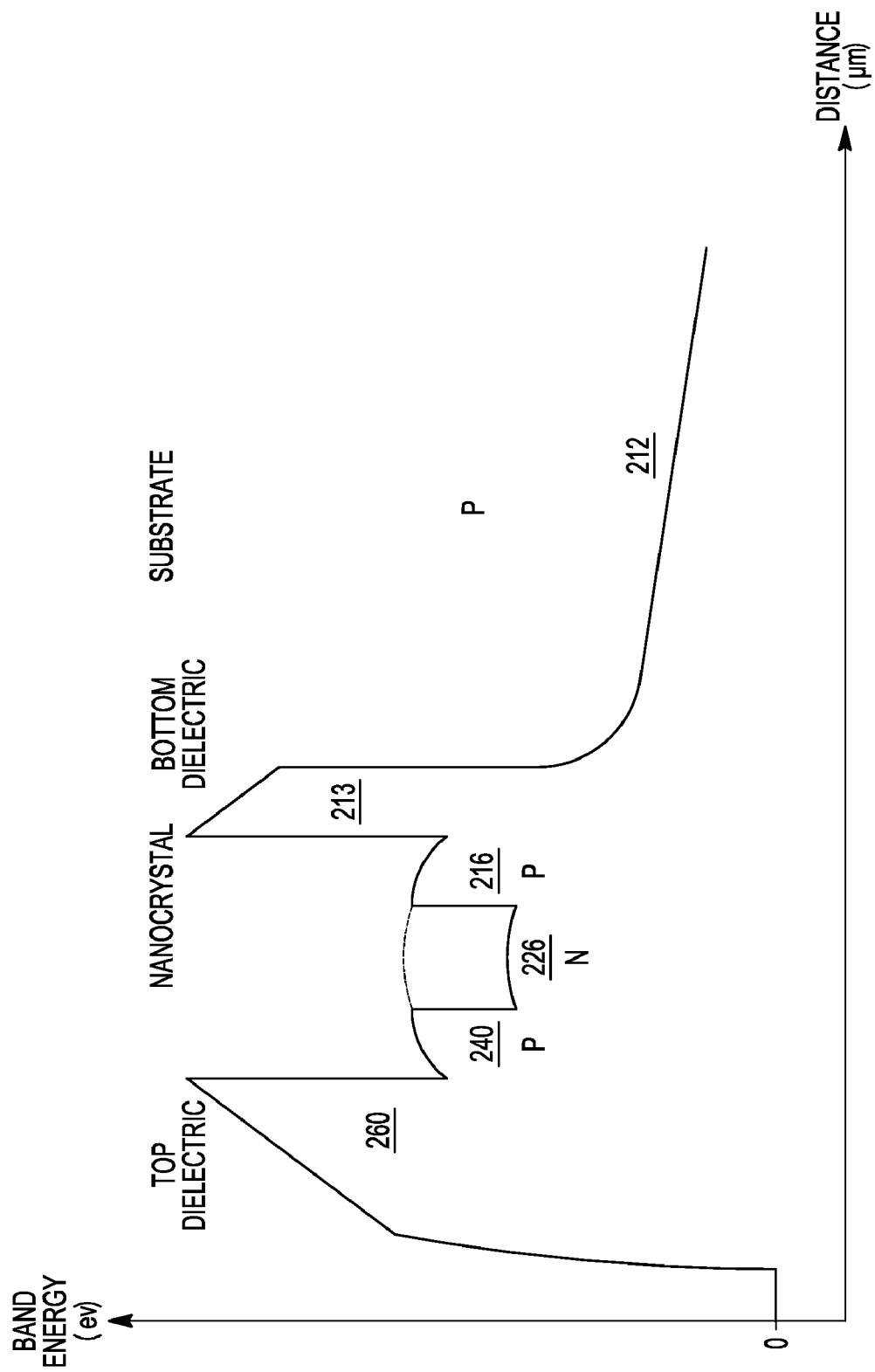
FIG. 16 illustrates in graphical form an energy band diagram of the nanocrystal memory structure illustrated in FIGS. 8-15.

Illustrated in FIG. 16 is a conduction band energy diagram of semiconductor device 200 having energy bands for the substrate 212, bottom dielectric layer 213, charge retainer globules 216 and 240 and charge storage globule 226 of nanocrystal 261 and top dielectric 260. The reference numbers of semiconductor device 200 that are provided in FIGS. 8-15 are correlated to the conduction band energy diagram of FIG. 15 to assist in better understanding the energy associated with each component of the semiconductor device 200. Additionally, exemplary doping types are illustrated. It should be understood that other doping types may be used. In the illustrated form the substrate 212 is assumed to have a P-type doping. While the energy diagram of FIG. 16 is a conduction band energy diagram, if, in contrast, the substrate 212 is N-type doping, a similar approach may be used to understand the valence band energy diagram. Thus the term "band energy" encompasses the energy associated with both conduction bands and valence bands, depending upon the application and what types of materials are used for the described globules. Also, as used herein the term band energy refers to an amount of energy and the term "energy band" refers to the physical area in which the band energy exists.

There are five distinct band energies illustrated in FIG. 16. A first band energy is associated with the bottom dielectric 213. A second band energy which is less than the first band energy is associated with the P-type charge retaining globule 216. A third band energy which is less than the second band energy is associated with the N-type charge storage globule 226. A fourth band energy which is greater than the third band energy is associated with the P-type charge retaining globule 240. In one form the second band energy and the fourth band energy are symmetrical energies as noted by the dashed line bridging above the third band energy of the N-type charge storage globule 226 so that the third band energy is in a well or hole relative to the adjoining second and fourth band energies. A fifth band energy which is greater than the fourth band energy is associated with the top dielectric 260.

The relevant portion of the energy diagram of FIG. 16 relative to the memory storage capability of semiconductor device 200 is within the charge storage globule 226 and charge retainer globules 240 and 216. In particular, the differential doping in charge storage globule 226 and charge retainer globules 216 and 240 causes well confinement of charge that has been injected into charge storage globule 226. For P-type substrates, the doping type for charge retainer globule 216, charge storage globule 226 and charge retainer globule 240 is respectively P, N, P. It should also be understood that none of charge retainer globule 216 and charge retainer globule 240 need to be doped. Because charge storage globule 226 is doped with N type compared to charge retainer globules 216 and 240, this gives charge storage globule 226 a lower conduction band energy and thus creates well confinement of charge within charge storage globule 226.

In another form, well confinement of charge can be achieved by using different semiconductor materials for charge storage globule 226 as opposed to charge retainer globules 216 and 240. For example, charge retainer globules 216 and 240 may be implemented as silicon and charge storage globule 226 may be implemented with either germanium or silicon germanium. These differing materials may be undoped in one form. In another form, the differing materials may be doped. The bandgap energy level of charge storage globule 226 is desired to be lower than the bandgap energy level of charge retainer globule 216 and charge retainer globule 240. In another form, if charge retainer globule 240 is not present, a differential in energy band within the nanocrystal 261 is still present and the advantages taught herein may be obtained.

By now it should be apparent that a memory having nanocrystals with differential doping is provided for improving the data retention ability of the memory. Data retention is improved as a result of higher charge confinement in charge storage globule 226 that is provided by the well confinement of charge. Programming, erasing and read speeds of a memory having a nanocrystal structure as described are also improved. Improvement in memory speeds are obtained because the thickness of the bottom dielectric and the top dielectric which function collectively as a gate dielectric is reduced. As a result of a thinner gate dielectric, the operating voltage required to program, read and erase a memory cell is reduced. The improved data retention improves the long-term reliability of a memory cell by reducing the electrical flux required to program the memory cell and this reduces damage (i.e. bond damage) to the gate dielectric of the memory cell.

By now it should be appreciated that there has been provided a method of making a semiconductor device using a semiconductor substrate. A first insulating layer having a first band energy is formed over the semiconductor substrate. A first semiconductor layer having a second band energy is formed on the first insulating layer. The first semiconductor layer is annealed to form a plurality of first charge retainer globules from the first semiconductor layer. A first protective film is formed over each charge retainer globule of the plurality of first charge retainer globules. A second semiconductor layer having a third band energy is formed over the plurality of first charge retainer globules. The second semiconductor layer is annealed to form a plurality of storage globules from the second semiconductor layer over the plurality of first charge retainer globules. A magnitude of the second band energy is between a magnitude of the first band energy and a magnitude of the third band energy. In another form a second insulating layer is formed over the plurality of storage globules. In another form a gate is formed over the second insulating layer. In yet another form a second protective film is formed over each storage globule of the plurality of storage globules. A third semiconductor layer having a fourth band energy is formed over the plurality of storage globules. The third semiconductor layer is annealed to form a second plurality of second charge retainer globules over the plurality of storage globules. In one form the second insulating layer has a fifth band energy. A magnitude of the fourth band energy is between the magnitude of the third band energy and a magnitude of the fifth band energy. In another form the first semiconductor layer is formed by depositing a layer of amorphous silicon that has a doping characteristic from one of a group of either undoped amorphous silicon or p-type amorphous silicon. In another form forming the second semiconductor layer is implemented by depositing a layer of amorphous silicon that is in-situ doped to be n-type. In another form the first semiconductor layer is formed by depositing a layer of silicon. In another form the second semiconductor layer is formed by depositing a layer that is one of a group of materials including silicon germanium and germanium. In another form the substrate is silicon. In yet another form the silicon is doped to p-type. In another form the first semiconductor layer is doped to p-type and the second semiconductor layer is doped to n-type. In yet another form the first semiconductor layer is silicon and the second semiconductor layer is silicon germanium. In yet another form each of the first semiconductor layer and the second semiconductor layer is doped so that the second band energy and the third band energy are conduction band energies. In yet another form each of the first semiconductor layer and the second semiconductor layer is doped so that the second band energy and the third band energy are valence band energies.

In another form there is provided a semiconductor memory device having a semiconductor substrate. A first insulating layer has a first energy band over the semiconductor substrate. A plurality of nanocrystals is on the first insulating layer, wherein each nanocrystal has a first charge retainer globule having a second energy band over the first insulating layer. A first protective film in each nanocrystal is over the first charge retainer globule. A storage globule in each nanocrystal has a third energy band over the first protective film. A magnitude of the second energy band is between a magnitude of the first energy band and a magnitude of the third energy band. A second insulating layer is over the plurality of nanocrystals. A gate is over the second insulating layer. In another form each nanocrystal further has a second protective film over the storage globule and a second charge retainer globule having a fourth energy band over the storage globule. The second insulating layer has a fifth energy band and a magnitude of the fourth energy band is between the magnitude of the third energy band and a magnitude of the fifth energy band. In another form the first energy band is a first conduction energy band and the second energy band is a second conduction energy band. The third energy band is a third conduction energy band, and the substrate is p-doped silicon. In this form the first insulating layer is oxide and the first charge retaining globule is p-doped silicon. The first storage globule is n-doped silicon. In yet another form the first energy band is a first conduction energy band and the second energy band is a second conduction energy band. The third energy band is a third conduction energy band and the first storage globule is one of a group of silicon germanium and germanium. The first charge retaining globule is silicon. In another form the first energy band is a first valence energy band and the second energy band is a second valence energy band. The third energy band is a third valence energy band. The substrate is n-doped silicon and the first insulating layer is oxide. The first charge retaining globule is n-doped silicon and the first storage globule is p-doped silicon.

In another form there is herein provided a method of forming a nanocrystal over an insulating layer. The insulating layer has a first band energy. A charge retaining globule having a second band energy is formed. An oxide layer around the charge retaining globule is grown. A charge storage globule is formed over the oxide layer. The charge storage globule has a third band energy, wherein the second band energy has a magnitude that is between a magnitude of the first band energy and a magnitude of the third band energy. In another form the charge retaining globule is formed by forming a semiconductor globule doped to a first doping type. The charge storage globule is formed by forming a semiconductor globule doped to a second doping type opposite to the first doping type.

In the foregoing specification, the invention has been described with reference to specific embodiments. However, one of ordinary skill in the art appreciates that various modifications and changes can be made without departing from the scope of the present invention as set forth in the claims below. For example, although only one deposition process was used to form the globules, a two-step or multi-step deposition process can be used. Accordingly, the specification and figures are to be regarded in an illustrative rather than a restrictive sense, and all such modifications are intended to be included within the scope of the present invention.

Moreover, the terms "front", "back", "top", "bottom", "over", "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. The terms "a" or "an", as used herein, are defined as one or more than one. The term "plurality", as used herein, is defined as two or more than two. The term another, as used herein, is defined as at least a second or more.

What is claimed is:

1. A method of making a semiconductor device using a semiconductor substrate, comprising:
   forming a first insulating layer having a first band energy over the semiconductor substrate;
   forming a first semiconductor layer having a second band energy on the first insulating layer;

annealing the first semiconductor layer to form a plurality of first charge retainer globules from the first semiconductor layer;

forming a first protective film over each charge retainer globule of the plurality of first charge retainer globules;

forming a second semiconductor layer having a third band energy over the plurality of first charge retainer globules; and annealing the second semiconductor layer to form a plurality of storage globules from the second semiconductor layer over the plurality of first charge retainer globules;

wherein a magnitude of the second band energy is between a magnitude of the first band energy and a magnitude of the third band energy.

2. The method of claim 1, further comprising:

forming a second insulating layer over the plurality of storage globules; and forming a gate over the second insulating layer.

3. The method of claim 2, wherein, further comprising.

forming a second protective film over each storage globule of the plurality of storage globules;

forming a third semiconductor layer having a fourth band energy over the plurality of storage globules; and annealing the third semiconductor layer to form a second plurality of second charge retainer globules over the plurality of storage globules, wherein:

the second insulating layer has a fifth band energy; and a magnitude of the fourth band energy is between the magnitude of the third band energy and a magnitude of the fifth band energy.

4. The method of claim 1, wherein the step of forming the first semiconductor layer comprises depositing a layer of amorphous silicon that has a doping characteristic comprising one of a group consisting of undoped and p-type.

5. The method of claim 4, wherein the step of forming the second semiconductor layer comprises depositing a layer of amorphous silicon that is in-situ doped to be n-type.

6. The method of claim 1, wherein the step of forming the first semiconductor layer comprises depositing a layer of silicon.

7. The method of claim 6, wherein the step of forming the second semiconductor layer comprises depositing a layer comprising one of a group consisting of silicon germanium and germanium.

8. The method of claim 1, further comprising:

forming the semiconductor substrate as a silicon substrate.

9. The method of claim 8, further comprising:

doping the silicon to p-type;

doping the first semiconductor layer to p-type; and doping the second semiconductor layer to n-type.

10. The method of claim 9, further comprising:

forming the first semiconductor layer as a silicon layer; and forming the second semiconductor layer as a silicon germanium layer.

11. The method of claim 8, further comprising:

doping the silicon to n-type;

doping the first semiconductor layer to n-type; and doping the second semiconductor layer to p-type.

12. The method of claim 1, further comprising:

doping each of the first semiconductor layer and the second semiconductor layer so that the second band energy and the third band energy are conduction band energies.

13. The method of claim 12, further comprising:

doping each of the first semiconductor layer and the second semiconductor layer so that the second band energy and the third band energy are valence band energies.

* * * * *